United States Patent [19]

Ono et al.

[11] Patent Number: 5,586,131
[45] Date of Patent: Dec. 17, 1996

[54] OSCILLATION POLARIZATION MODE SELECTIVE SEMICONDUCTOR LASER, LIGHT SOURCE APPARATUS AND OPTICAL COMMUNICATION SYSTEM USING THE LASER

[75] Inventors: Takeo Ono, Tokyo; Masao Majima, Isehara; Toshihiko Ouchi, Tokyo, all of Japan

[73] Assignee: Canon Kabushiki Kaisha, Tokyo, Japan

[21] Appl. No.: 352,759

[22] Filed: Dec. 5, 1994

[30] Foreign Application Priority Data

Dec. 10, 1993 [JP] Japan ................... 5-310592

[51] Int. Cl.⁶ .................................................. H01S 3/10
[52] U.S. Cl. .............................. 372/19; 372/27; 372/96
[58] Field of Search ................................ 372/9, 19, 20, 372/23, 27, 43–50, 96

[56] References Cited

U.S. PATENT DOCUMENTS

| | | | |
|---|---|---|---|
| 4,612,645 | 9/1986 | Liu et al. | 372/45 |
| 4,633,474 | 12/1986 | Akiba et al. | 372/19 |
| 4,918,701 | 4/1990 | Amann et al. | 372/50 |
| 5,155,737 | 10/1992 | Ikeda et al. | 372/43 |
| 5,392,308 | 2/1995 | Welch et al. | 372/20 X |

FOREIGN PATENT DOCUMENTS

| | | | |
|---|---|---|---|
| 0361035 | 4/1990 | European Pat. Off. | H01S 3/25 |
| 62-042593 | 2/1987 | Japan . | |
| 62-144426 | 6/1987 | Japan . | |
| 2-159781 | 6/1990 | Japan . | |
| 2159781 | 9/1990 | Japan . | |
| 9214174 | 8/1992 | WIPO . | |

OTHER PUBLICATIONS

"Analysis of TE and TM Modes in DFB Lasers by Two-Dimensional Theory" by Yoshikazu Hori et al.; IEEE Journal Of Quantum Electronics. vol. 27; No. 7, Jul. 1991; pp. 1874–1885.

"Polarization switching in InGaAsP/InP distributed-feedback lasers with a strained active layer" by A. I. Guriev et al./ Soviet Technical Physics Ltrs. vol. 19, No. 12, Dec. 12, 1993, N.Y.; pp. 741–743.

Primary Examiner—John D. Lee
Attorney, Agent, or Firm—Fitzpatrick, Cella, Harper & Scinto

[57] ABSTRACT

A distributed feedback semiconductor laser selectively performs one of two oscillations in different polarization modes having different polarization planes. The laser includes a substrate, a light waveguide formed on the substrate, which at least partially includes an active layer, a diffraction grating formed around the waveguide, and an injecting unit for injecting a modulation current into a portion of the waveguide. The waveguide and the grating are constructed such that oscillation wavelengths of the polarization modes are different from each other and minimum values of threshold gain in the polarization modes near the Bragg wavelength are approximately equal to each other. The semiconductor laser can be driven by a minute modulation current and prevents degradation of response characteristics due to dynamic wavelength fluctuation in a high-frequency range when used in optical communication systems in which the switching of polarization mode is performed.

11 Claims, 20 Drawing Sheets

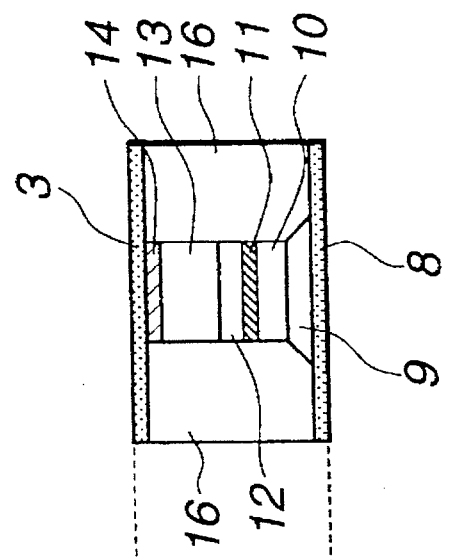
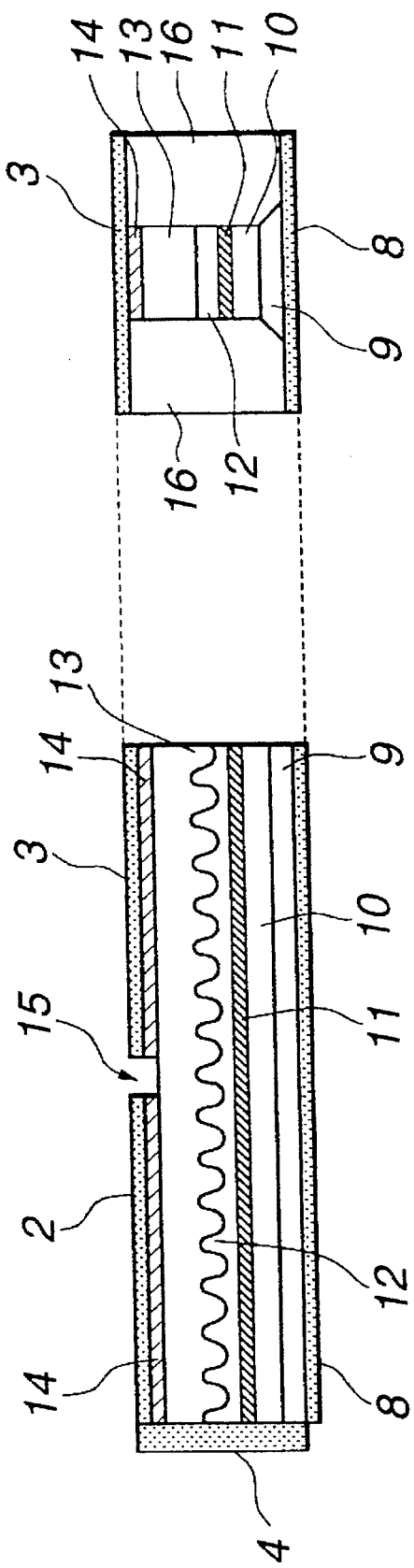

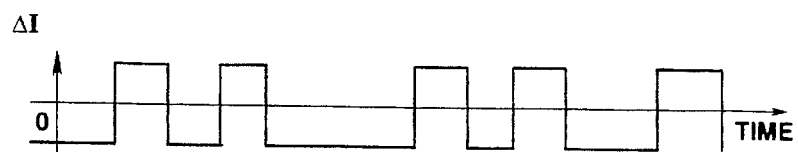
FIG.9A
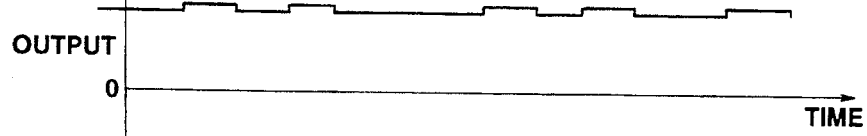
FIG.9B OUTPUT
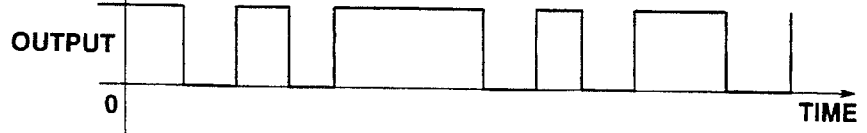
FIG.9C OUTPUT
FIG.9D OUTPUT

OSCILLATION POLARIZATION MODE SELECTIVE SEMICONDUCTOR LASER, LIGHT SOURCE APPARATUS AND OPTICAL COMMUNICATION SYSTEM USING THE LASER

BACKGROUND OF THE INVENTION

1. Field of the Invention

The present invention relates to a semiconductor laser suitable for use as a light source apparatus in the field of optical frequency division multiplexing (FDM) communications, for example, and further relates to an optical communication system and a light source apparatus which use the above-mentioned semiconductor laser, respectively.

2. Related Background Art

In recent years, increased transmission capacity in the field of optical communications has become desirable, and the development of optical FDM communications, in which signals at a plurality of optical frequencies are multiplexed in a single optical fiber, has been advanced.

There are two kinds of optical FDM communication methods, which are classified by the type of light signal used in the receiving technique. One method is a coherent optical communication, in which a beat signal is produced between signal light and light from a local oscillator to obtain an intermediate-frequency output, and that output is detected. The other method is one, in which only light at a desired wavelength or optical frequency is selected by a tunable filter, and the thus-selected light is detected. The tunable filter used in the latter method may comprise one of a Max-Zehnder type, a fiber Fabry-Perot type, an acousto-optic (AO) modulator type, a semiconductor distributed feedback (DFB) filter type and the like. Especially, in the semiconductor DFB filter type, the transmission bandwidth can be narrowed down to less than 0.5 Å and the optical amplification function (approx. 20 dB) exists, so the multiplicity of transmission wavelengths of signals can be increased and the minimum receiving sensitivity can be improved (i.e., the minimum receiving intensity can be reduced). An example of a semiconductor type filter is disclosed in T. Numai et al. "Semiconductor Tunable Wavelength Filter", OQE 88-65, 1988. Further, since this type of filter can be formed with the same material as a semiconductor photodetector, integration and downsizing are feasible. From the foregoing, the suitability of a semiconductor DFB type optical filter for optical FDM communications is clear.

On the other hand, in an optical communication system using a semiconductor filter as a light source in an optical transmitter, the semiconductor laser is required to have stable oscillation and polarization direction and to maintain a dynamic single mode. Therefore, as a semiconductor laser, DFB laser, distributed Bragg reflector (DBR) laser, or the like is used since they radiate only in the transverse electric (TE) mode. At present, the most popular modulation system for transmission signals in transmission systems is digital amplitude modulation, or amplitude shift keying (ASK) in which a drive current injected into a laser is directly modulated, or digital frequency modulation or frequency shift keying (FSK) in which a signal current having a minute amplitude is superposed on a bias current.

In the direct optical intensity or amplitude modulation system, however, the amplitude of a modulation current required for driving the laser needs to be large. In addition, the bias current point of the laser needs to be close to or less than its threshold. As a result, such a modulation system is unsuitable for high-frequency modulation. More particularly, fluctuation of its oscillation wavelength during the modulation of the semiconductor laser is relatively large. When the fluctuation surpasses the pass bandwidth of a tunable filter, the shape of demodulated signal is deformed, leading to an increase in an error rate of received signals and degradation of response characteristics during the high-frequency modulation state.

On the other hand, in the direct frequency modulation system, the channel width is narrow and hence the tracking control of a tunable filter needs to be accurately performed. Further, there is a tendency for crosstalk between wavelengths indicating codes "1" and "0" to occur depending on a change in surroundings, and an error rate of received signals increases. Moreover, since the FM modulation efficiency of a semiconductor laser needs to remain unchanged or flat over a wide range, the device is difficult to fabricate.

Optical communication apparatuses for solving the above problems are proposed in Japanese Patent Laid-Open Nos. 62(Showa)-42593, 62(Showa)-144426 and 2(Heisei)-159781. In those optical communication apparatuses, a DFB laser is caused to selectively output one of two polarization modes according to a transmission signal, and light emitted from the laser is transmitted through a polarizer and supplied to a light receiving device.

Details of those optical communication apparatuses will be described below.

FIG. 1 illustrates the schematic structure of the optical communication apparatus. In FIG. 1, reference numeral 101 designates a light source constructed of a DFB laser described below. A polarizer 102 is disposed in front of the light source 101. Light emitted from the light source 101 is transmitted through the polarizer 102, and is transmitted to a light receiving device 104 via an optical fiber 103. The light source 101 selectively outputs one of transverse electric (TE) and transverse magnetic (TM) modes based on a modulation signal from a signal source 105. Reference numeral 106 designates a bias current source. The polarizer 102 is disposed to transmit only one polarization mode of TE and TM modes.

FIGS. 2A and 2B illustrate a DFB laser used as the above-discussed optical communication apparatus. The DFB laser is fabricated as follows: A first order diffraction grating 112 is initially formed on an n-type InP substrate 110. On the grating 112, an n-type GaInAsP light waveguide layer 114, an undoped GaInAsP active layer 116, a p-type GaInAsP anti-meltback layer 118, a p-type InP clad layer 119 and a p⁺-type GaInAsP ohmic contact layer 120 are formed in this order.

In an etching process, parts of the semiconductor layers 120, 119, 118, 116 and 114 and the first order diffraction grating 112 are removed and a mesa stripe portion 130 is formed. Then, a p-type InP layer 122, an n-type InP layer 123 and an undoped GaInAsP cap layer 124 are consecutively grown on the surroundings of the mesa stripe portion 130 to bury the surroundings. P-type electrodes 126a, 126b and 127 are deposited on the ohmic contact layer 120 and the cap layer 124, and an n-type electrode 128 is formed on the bottom surface of the substrate 110. Antireflection (AR) coatings 129a and 129b are provided on end facets of the cavity.

In the thus-fabricated DFB laser, when a constant bias current is injected through the electrodes 126a and 126b and a predetermined current is injected through the electrode 127, the DFB laser oscillates in TM mode. When the polarizer 134 disposed on the emission side of the DFB laser is set such that the TM mode oscillation light cannot be transmitted through the polarizer 134, output light is blocked by the polarizer 134 and no light can be taken out (off-state). When the current flowing through the electrode 127 is adjusted and an amount of equivalent phase shift is changed, TE mode light begins to be output. At this time, the output light can be taken out from the polarizer 134. In the optical communication apparatus, since the area of the electrode 127 is small, the DFB laser can be operated at a high speed by a small modulation current of about 10 mA.

However, the conventional arts do not inform with respect to minimum values of threshold gain of the active layer between TE and TM modes in the above DFB layer. In the case that a difference in minimum values of threshold gain is large, this reduces the decrease of the modulations drive current in the optical communication method in which the polarization mode is switched. Therefore, dynamic wavelength fluctuation in a high frequency range is not so highly improved, even compared with the ASK modulation.

SUMMARY OF THE INVENTION

It is an object of the present invention to provide a semiconductor laser which can be driven by a minute modulation current and can prevent degradation of response characteristics due to dynamic wavelength fluctuation in a high-frequency range when used in optical communication methods in which the switching of polarization mode is performed, and to provide a light source apparatus and an optical communication system and method using this semiconductor laser.

The invention is directed to a distributed feedback semiconductor laser that performs oscillations in different polarization modes having different polarization planes. The laser has a light waveguide that includes an active layer formed on a substrate. A diffraction grating is formed around the waveguide and a modulation current is injected into a portion of the waveguide.

According to one aspect of the present invention, there is provided a distributed feedback semiconductor laser for selectively performing one of two oscillations in different polarization modes having different polarization planes. The laser includes a substrate, a light waveguide formed on the substrate, which at least partially includes an active layer, a diffraction grating formed around the waveguide, and an injecting device for injecting a modulation current into a portion of the waveguide. The waveguide and the grating are constructed such that oscillation wavelengths of the two polarization modes are different from each other and minimum values of threshold gain in the two polarization modes near Bragg wavelength are approximately equal to each other.

In the above semiconductor laser, when the active layer includes a multi-quantum well structure, the pitch of the grating may be set such that the Bragg wavelength is shorter than the peak wavelength of a gain spectrum of the active layer, in order that minimum values of threshold gain in the two polarization modes near Bragg wavelength are approximately equal to each other.

Further, when the active layer includes a multi-quantum well structure which is constructed such that tensile strain is introduced into the multi-quantum well structure and the level of light holes, which is the second level of holes in the active layer, is equal to or higher than the level of heavy holes which is the ground level of holes, minimum values of threshold gain in the two polarization modes near Bragg wavelength can be approximately equal to each other.

According to another aspect of the present invention, there is provided a light source apparatus which includes the above semiconductor laser, and a unit for selecting only light in one of the two polarization modes from light outputs in the two polarization modes emitted by the laser (e. g., a polarizer).

According to yet another aspect of the present invention, there is provided an optical communication system which includes a transmitter including the above light source apparatus, a transmission unit for transmitting the light selected by the selecting unit, and a receiver for receiving the light transmitted by the transmission unit.

According to still another aspect of the present invention, there is provided an optical communication method which includes a step of preparing the above light source apparatus, a step of supplying to the laser a current which is produced by superposing a modulation current modulated in accordance with a transmission signal, on a predetermined bias current, a step of selecting a light signal which is intensity-modulated in accordance with the transmission signal, by a selecting unit, and a step of transmitting the light signal to a receiver.

These advantages and others will be more readily understood in connection with the following detailed description of the preferred embodiments in conjunction with the drawings.

BRIEF DESCRIPTION OF THE DRAWINGS

FIGS. 6A and 6B are respectively side and front cross sectional views illustrating the structure of a semiconductor laser constructed in accordance with the present invention.

FIG. 9A illustrates a modulation drive current injected into the semiconductor laser of FIGS. 6A and 6B, and FIGS. 9B, 9C and 9D respectively illustrate waveforms of light outputs at respective places.

DESCRIPTION OF THE PREFERRED EMBODIMENTS

First Embodiment

Figure 1:
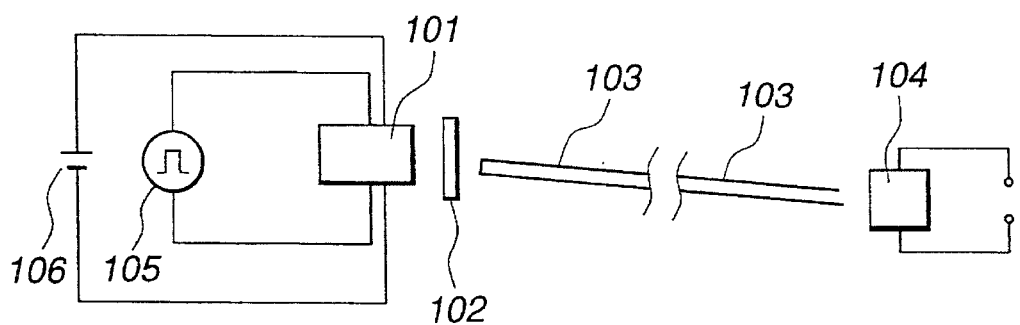
FIG. 1 illustrates the schematic structure of a conventional optical communication system.
Figures 2A, 2B:
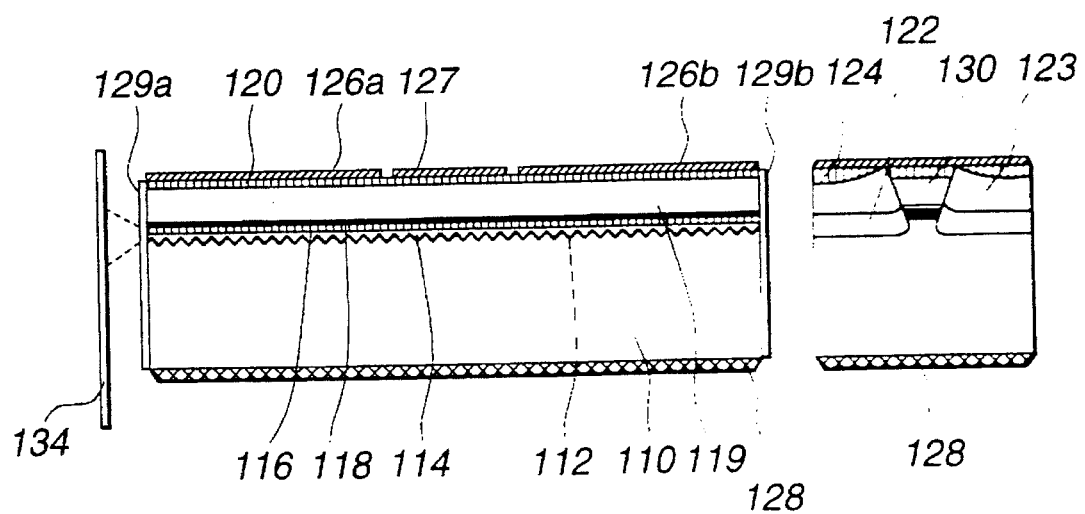
FIGS. 2A and 2B are respectively side and front cross sectional views illustrating the structure of a distributed feedback laser used in FIG. 1.
Figure 3:
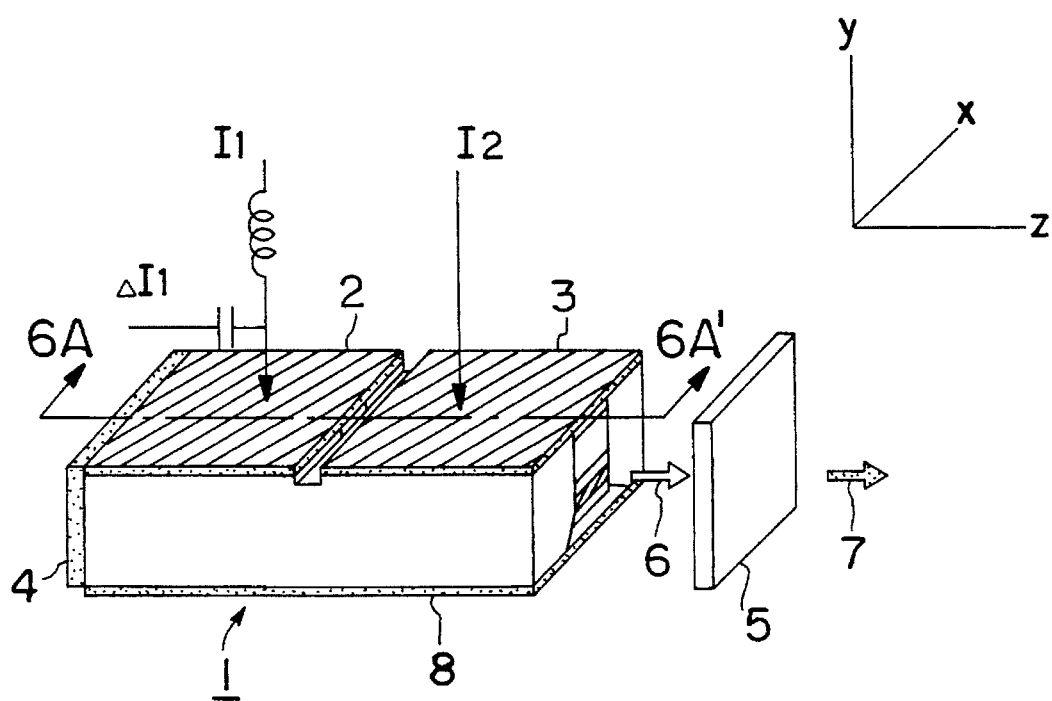
FIG. 3 illustrates the schematic structure of a light source apparatus using a semiconductor laser constructed in accordance with the present invention.

A first embodiment of the present invention will be described with reference to FIG. 3 which illustrates an optical communication method using a semiconductor laser constructed in accordance with the present invention. In FIG. 3, reference numeral 1 is a two-electrode semiconductor laser of the present invention. Reference numerals 2, 3 and 8 are respectively electrodes. Reference numeral 4 is an antireflection (AR) coating. Reference numeral 5 is a Glan-Thompson prism which acts as a polarizer. Reference numeral 6 is light emitted by the semiconductor laser 1 and reference numeral 7 is light that is transmitted through the polarizer 5.

Figure 4:
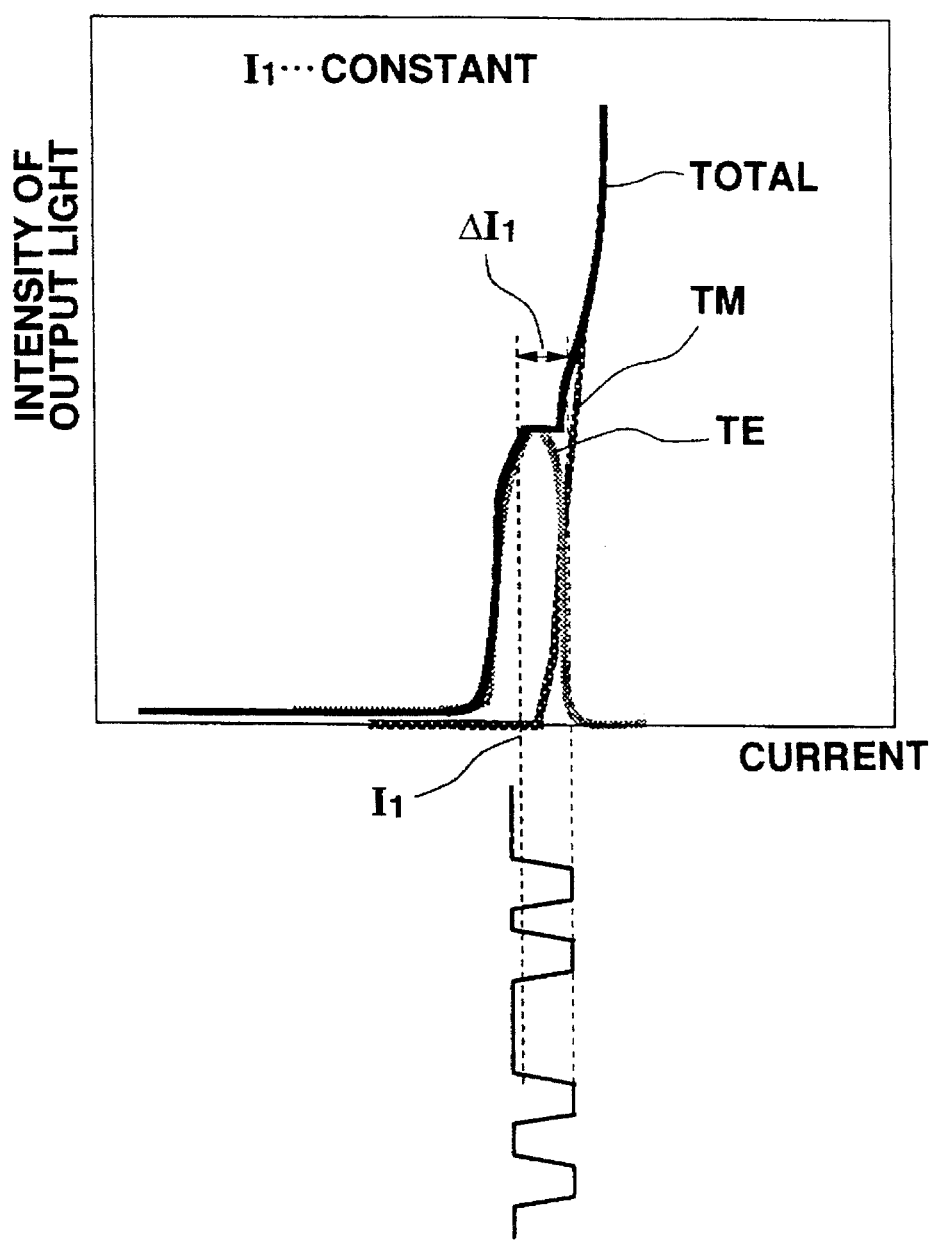
FIG. 4 illustrates a manner of oscillation switching between two polarization modes performed by a modulation current injected into a semiconductor laser shown in FIG. 3.

In the structure of FIG. 3, when a constant current $I_2$ is injected through the electrode 3 on a side opposite the side of the AR coating 4 and the amount of a current $(I_1+\Delta I_1)$ injected through the electrode 2 is varied, the switching between TE and TM modes takes place as illustrated in FIG. 4. In FIG. 4, abscissa and ordinate respectively indicate the amount of current $(I_1+\Delta I_1)$ injected through the electrode 2 and an output of the laser 1. When a small-amplitude modulation current $\Delta I_1$, which is modulated according to a digital signal, is superposed on a bias current $I_1$ which is slightly smaller than a current by which the switching occurs, light in one of two polarization modes having different polarization planes is selectively emitted in accordance with the digital signal. The amplitude of the modulation current $\Delta I_1$ is set such that the output intensity of TE mode emitted during the injection of current $I_1$ is equal to the output intensity of TM mode emitted during the injection of current $(I_1+\Delta I_1)$.

Figure 5:
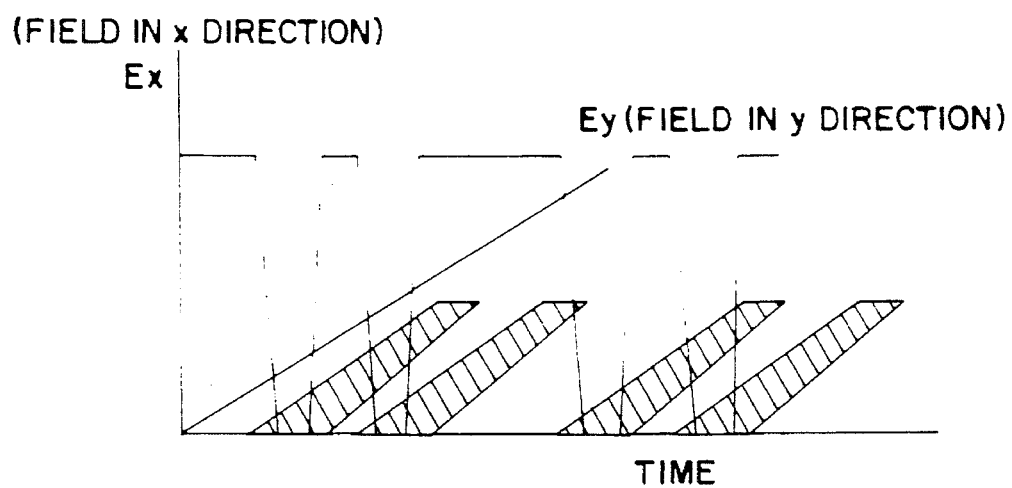
FIG. 5 three-dimensionally illustrates a change with time in electric field amplitude of waveguide light observed at a central portion of a waveguide emission end facet of the semiconductor laser of FIG. 3.

FIG. 5 three-dimensionally illustrates a change with time of the electric field amplitude of waveguide light observed at a central portion of the emission end facet of the semiconductor laser 1, which occurs when the above current is injected. In FIG. 5, an abscissa is a time axis, $E_x$ indicates an electric field component in an x direction and $E_y$ indicates an electric field component in a y direction. TM mode of the electric field component $E_y$ is emitted in phase with the waveform of the digital signal, and TE mode of the electric field component $E_x$ is emitted in anti-phase with the waveform of the digital signal. When the orientation of transmission axis of the polarizer 5 in FIG. 3 is adjusted to the y direction, only TM mode oscillation light of the light 6 emitted from the laser 1 is transmitted through the polarizer 5, and the modulated light 7, which is intensity-modulated in phase with the waveform of the digital signal or modulation current $\Delta I_1$, can be obtained. On the other hand, when the orientation of the transmission axis of the polarizer 5 is adjusted to the x direction, only TE mode oscillation light of the light 6 emitted from the laser 1 transmits through the polarizer 5, and the modulation light 7, which is intensity-modulated in anti-phase with the waveform of the digital signal, can be obtained. In both cases, only one polarization mode is transmitted through the polarizer 5, and thus an optical signal having a deep degree of modulation can be obtained. Further, since the sum of outputs in TE and TM modes is substantially constant at all times, a change in photon density in the cavity is small. In addition, by fabricating the laser as described below, the amplitude of the modulation current can be reduced (e.g., 2 mA–3 mA) and a change in the current density can also be made small.

In a conventional ASK modulation, the amplitude of current is large, and the refractive index, which resonant light senses, is varied by plasma effect according to a change in the current density. Hence the Bragg wavelength varies accordingly. Further, the density of carriers decreases at a portion at which the photon density concentrates in the cavity, and thus the carrier density distribution and the photon density distribution deviate from each other and the degree of deviation varies depending on the magnitude of the photon density. This phenomenon is termed the hole burning effect. Thus, the refractive index, which resonant mode light senses, varies also in this respect. As a result, dynamic wavelength fluctuation occurs due to those phenomena.

In contrast thereto, in the semiconductor laser of the present invention, a change in the carrier density in the entire cavity is small and a change in the photon density is small as well. Therefore, the wavelength fluctuation due to the plasma effect and hole burning effect is greatly reduced. As a result, when the semiconductor laser of the present invention is used in optical communications, frequency response characteristics can be improved.

The embodied structure of a semiconductor laser of the present invention will be described. FIGS. 6A and 6B are respectively 6A—6A' cross sectional view of FIG. 3 and a cross sectional front view viewed from the light emission side. The semiconductor laser of FIGS. 6A and 6B is fabricated in the following manner.

On an n-type GaAs substrate 9, an n-type $Al_{0.5}Ga_{0.5}As$ lower clad layer 10, an active layer 11 and a p-type $Al_{0.2}Ga_{0.8}As$ light waveguide layer 12 are formed in that order. The active layer 11 is constructed of a multi-quantum well structure which includes a plurality of pairs of intrinsic GaAs well layers (thickness: 60 Å) and intrinsic $Al_{0.2}Ga_{0.8}As$ barrier layers (thickness: 100 Å). Those well and barrier layers are alternately layered. Then, a first order diffraction grating is formed on the light guide layer 12 using photolithography. On the grating formed on the light guide layer 12, a p-type $Al_{0.5}Ga_{0.5}As$ upper clad layer 13 and a p-type GaAs cap layer 14 are grown in this order. Those semiconductor layers are grown using molecular beam epitaxy (MBE). Chemical vapor deposition (CVD) or the like may be used.

In an etching process, parts of the substrate 9 and semiconductor layers 10–14 are removed and a mesa stripe portion is formed extending in a laser resonance direction. Then, a high-resistance $Al_{0.5}Ga_{0.5}As$ burying layer 16 is grown on the surroundings of the mesa stripe portion to bury the surroundings, using liquid phase epitaxy (LPE). An Au/Cr film is deposited on the cap layer 14 and the burying layer 16. The Au/Cr film is divided at a groove-like separation region 15 which extends down to the cap layer 14 and the burying layer 16. Thus, electrodes 2 and 3 are formed. Further, an electrode 8 of AuGe/Au film is formed on the bottom surface of the substrate 9 and the burying layer 16. An antireflection coating 4 of $SiO_2$ film is provided on an end facet of the cavity on a side opposite the light emission side.

In this structure, the pitch of the grating formed on the light guide layer 12 is set such that the Bragg wavelength becomes shorter than the peak wavelength of a gain spectrum of the active layer 11. Thus, minimum values of threshold gain in the respective polarization modes near the Bragg wavelength are made approximately equal to each other. Details thereof will be described below.

In general, in a DFB laser having an active layer of multi-quantum well structure, the gain coefficient of TM mode is smaller than that of TE mode. The reason therefor is that energy contribution to TM mode light due to recombination between a level of heavy holes and a ground level of electrons ($E_{hh0}-E_{e0}$), which is a minimum level of excitons consisting of electron-hole pairs, is small and the quantum efficiency, at which recombined carriers are converted to light, is also small. In this structure, the pitch of the diffraction grating is set such that the wavelength corresponding to energy between a ground level of light holes, that is the second level of holes, and a ground level of electrons ($E_{lh0}-E_{e0}$) is close to the DFB Bragg wavelength. Thus, a difference between gain coefficients of the respective modes is reduced. This fact is known from FIG. 7 which illustrates a calculation example of gain described at pp. 142–143 of "IOOC Technical Digest", 1983, Tokyo, for example.

Figure 7:
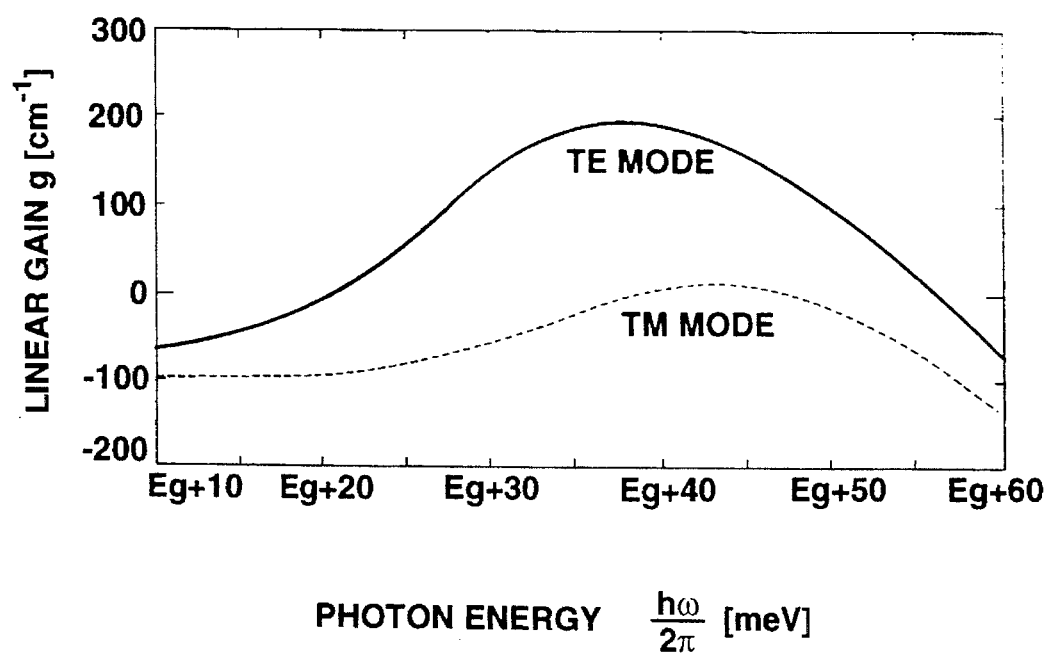
FIG. 7 illustrates the relationship between photon energy and linear gain in TE and TM polarization modes of the semiconductor laser of FIGS. 6A and 6B.

In FIG. 7, the ordinate indicates a linear gain and the abscissa indicates photon energy. There exists the relation of wavelength: $\lambda \approx 1.24 \times 2\pi/\hbar\omega(\mu m)$, and the shorter the wavelength is, the larger the photon energy $\hbar\omega/2\pi$ is. The photon energy, at which the gain of TE mode is largest, corresponds to the transition between $E_{hh0}-E_{e0}$, and the photon energy, at which the gain of TM mode is largest, corresponds to the transition between $E_{lh0}-E_{e0}$. The gain peak of TM mode lies on a shorter wavelength side of the gain peak of TE mode. Therefore, if the Bragg wavelength is adjusted such that the oscillation takes place in the vicinity of a wavelength corresponding to the transition between $E_{lh0}-E_{e0}$, the gain difference between TE and TM modes can be lowered.

In a conventional DFB laser, since the peak of gain spectrum of an active layer corresponds to the transition between $E_{hh0}-E_{e0}$, the pitch of an diffraction grating is set such that the Bragg wavelength lies on a longer wavelength side of the peak of that gain spectrum. Thus, optical absorption in the active layer is reduced. In contrast, in the semiconductor laser of FIGS. 6A and 6B, the pitch of the diffraction grating is formed such that the Bragg wavelength lies on a shorter wavelength side of the peak of TE gain spectrum. Hence the gain difference between TE and TM modes is lessened.

Figure 8:
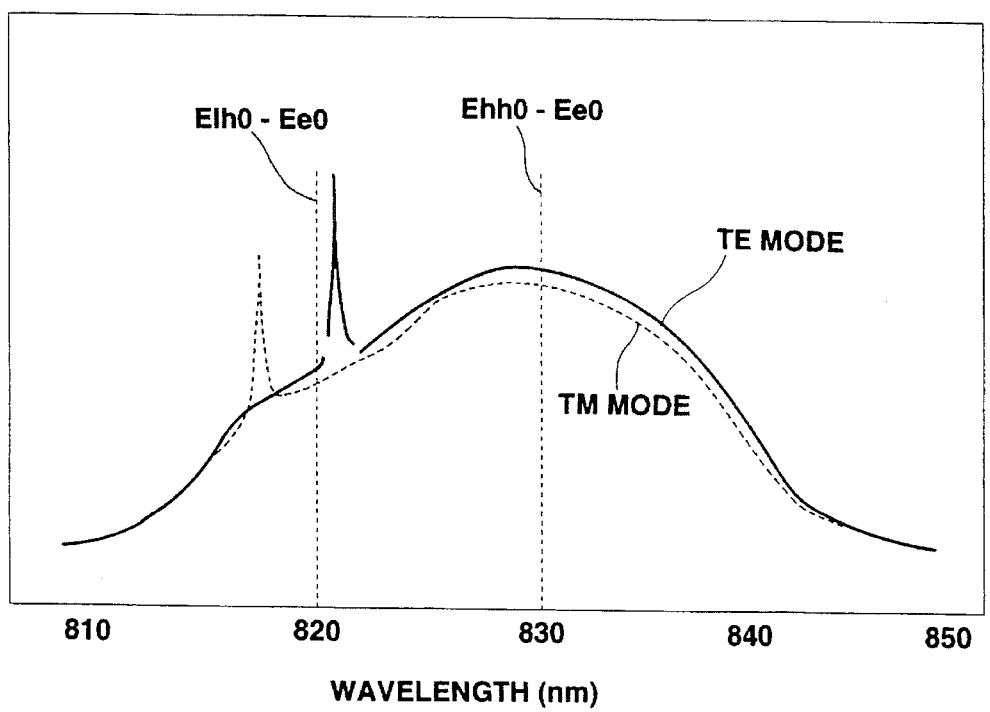
FIG. 8 illustrates oscillation spectra in TE and TM polarization modes of the semiconductor laser of FIGS. 6A and 6B.

The operation of this embodiment will be described. FIG. 8 illustrates an oscillation spectrum appearing when bias currents are injected across the electrodes 2 and 3 and the electrode 8 of the structure shown in FIGS. 6A and 6B and a state just prior to the laser oscillation is established. The wavelength corresponding to the transition energy between the level of light holes and the ground level of electrons ($E_{lh0}-E_{e0}$) is 820 nm, and the wavelength corresponding to the transition energy between the level of heavy holes and the ground level of electrons ($E_{hh0}-E_{e0}$) is 830 nm. Oscillation spectra of TE mode (solid line) and TM mode (dotted line) are approximately identical with each other. The pitch of the diffraction grating is set to 244 nm such that the distributed feedback wavelength by the diffraction grating formed on the light guide layer 12 becomes shorter than the wavelength corresponding to $E_{lh0}-E_{e0}$. Thus, the resonance peak of TE mode becomes 820.0 nm and the resonance peak of TM mode becomes 818.6 nm.

The switching between TE and TM modes takes place as described above when a digital signal having the amplitude of 2 mA is superposed on a bias current injected through the electrode 3. FIGS. 9A through 9D illustrate waveforms of respective signals. FIG. 9A illustrates the waveform of a modulation current on which the digital signal is superposed, FIG. 9B illustrates the waveform of a light output emitted from the laser 1, and FIG. 9C illustrates the waveform of a light output which is transmitted through the polarizer 5 whose crystal axis is oriented in the x direction in FIG. 3. The output of light emitted from the laser 1 remains substantially unchanged as illustrated in FIG. 9B, and the output waveform of light transmitted through the polarizer 5 is in an anti-phase relationship with the modulation current, as illustrated in FIG. 9C, since the polarizer 5 transmits only light oscillating in TE mode. When the crystal axis of the polarizer 5 is oriented in the y direction, only light oscillating in TM mode is transmitted and the transmitted light has an output waveform that is in an in-phase relationship with the modulation current, as illustrated in FIG. 9D. The dynamic wavelength fluctuation of the modulation light is suppressed since fluctuations of carrier and photon densities in the laser cavity are small as described above. The wavelength fluctuation is less than 0.01 nm when the modulation frequency is 5 GHz.

Second Embodiment

Figures 10A, 10B:
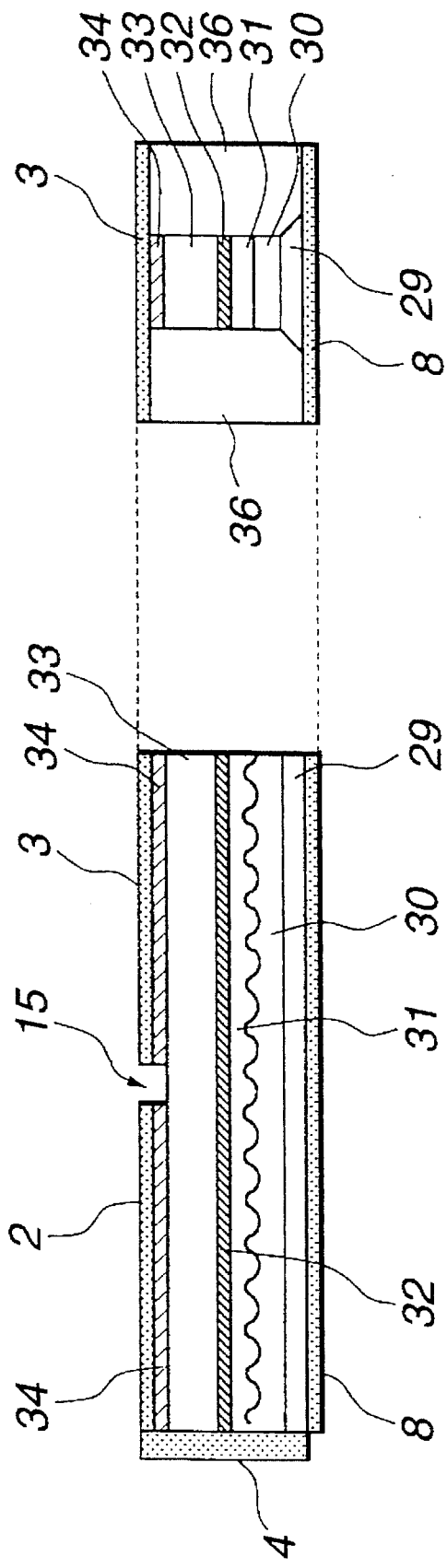
FIGS. 10A and 10B are respectively side and front cross sectional views illustrating the structure of a further semiconductor laser constructed in accordance with the present invention.

A second embodiment of a semiconductor laser of the present invention will be described with reference to FIGS. 10A and 10B. FIGS. 10A and 10B are respectively the 6A—6A' cross sectional view of FIG. 3 and a cross sectional front view taken along a lateral direction. The semiconductor laser of this embodiment is fabricated in the following manner.

On an n-type InP substrate 29, an n-type InP lower clad layer 30 is grown, and a first order diffraction grating having a depth of 0.05 μm is formed on the lower clad layer 30 using photolithography. Then, on the lower clad layer 30 on which the grating is formed, an n-type $In_{0.71}Ga_{0.29}As_{0.62}P_{0.38}$ lower guide layer 31 having a thickness of 0.2 μm, an active layer 32, a p-type InP upper clad layer 33 and a p-type $In_{0.59}Ga_{0.41}As_{0.9}P_{0.1}$ contact layer 34 are formed in this order. The active layer 32 is constructed of a multi-quantum well structure which includes ten pairs of intrinsic $In_{0.53}Ga_{0.47}As$ well layers (thickness: 50 Å) and intrinsic $In_{0.28}Ga_{0.72}As$ barrier layers (thickness: 50 Å). Those well and barrier layers are alternated. Those semiconductor layers are grown using MBE, CVD or the like.

In an etching process, parts of the substrate 29 and the semiconductor layers 30–34 are removed and a mesa stripe portion is formed extending in the laser resonance direction. Then, a high-resistance InP burying layer 36 is grown on the surroundings of the mesa stripe portion to bury the surroundings, using LPE. A Cr/AuZnNi/Au film is deposited on the contact layer 34 and the burying layer 36, and the Cr/AuZnNi/Au film is divided at a groove-like separation region 15 which extends down to the contact layer 34 and the burying layer 36. Thus, electrodes 2 and 3 are formed. Further, an electrode 8 of AuGeNi/Au film is formed on the bottom of the substrate 29 and the burying layer 36. An antireflection coating 4 of $SiO_2$ film is provided on an end facet of the cavity on a side opposite the light emission side.

In this embodiment, the barrier layer of the active layer 32 is formed with material whose lattice constant is smaller than that of the substrate 29, so that a tensile strain of about 1.7% appears in the barrier layer. Due to the introduction of tensile strain into the multi-quantum well structure of the active layer 32, transition energy between the level of heavy holes and the ground level of electrons ($E_{hh0}-E_{e0}$) is made equal to transition energy between the level of light holes and the ground level of electrons ($E_{1h0}-E_{e0}$), and minimum values of threshold gain in respective polarization modes near the Bragg wavelength become approximately equal to each other.

Figure 11:
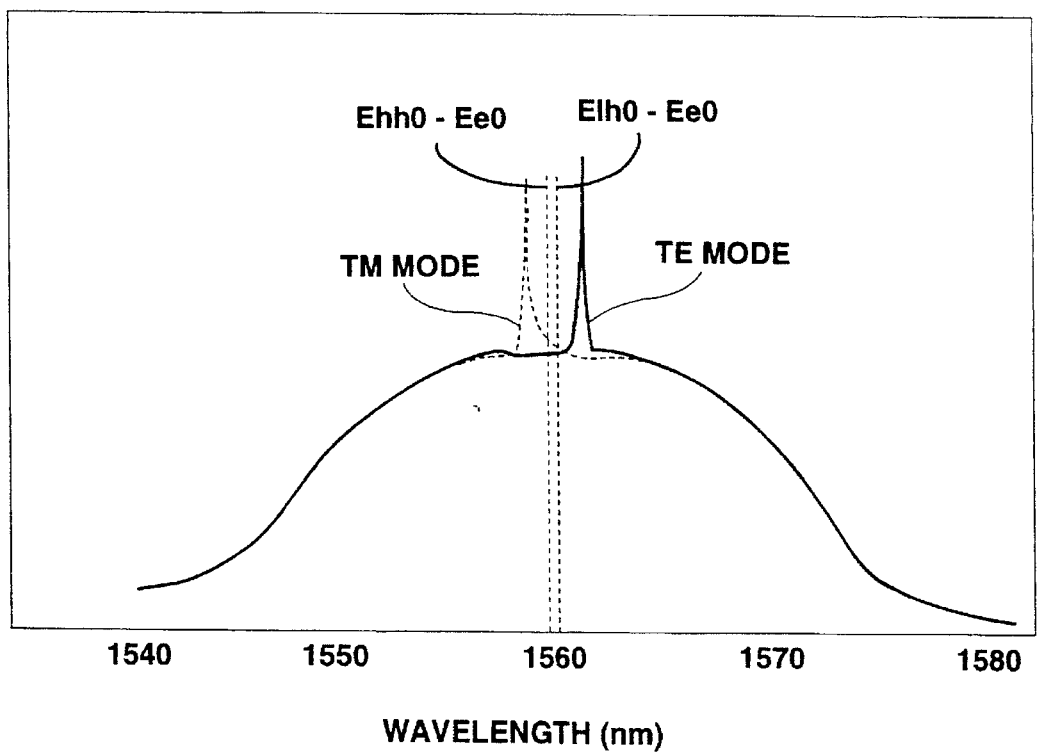
FIG. 11 illustrates oscillation spectra in TE and TM polarization modes of the semiconductor laser of FIGS. 10A and 10B.

The operation of this embodiment will be described. FIG. 11 illustrates oscillation spectra observed when bias currents are injected across the electrodes 2 and 3 and the electrode 8 of the structure shown in FIGS. 10A and 10B and a state immediately prior to laser oscillation is established. The wavelength corresponding to the transition energy between the level of light holes and the ground level of electrons ($E_{1h0}-E_{e0}$) is approximately 1.56 μm, and the wavelength corresponding to the transition energy between the level of heavy holes and the ground level of electrons ($E_{hh0}-E_{e0}$) is also approximately 1.56 μm. Oscillation spectra of TE mode (solid line) and TM mode (dotted line) are substantially identical with each other. The pitch of the diffraction grating is set to 240 nm such that the distributed feedback wavelength by the diffraction grating formed on the lower clad layer 30 is shorter than the wavelength corresponding to $E_{1h0}-E_{e0}$. Thus, the resonance peak of TE mode becomes 1.562 μm and the resonance peak of TM mode becomes 1.558 μm.

The switching between TE and TM modes takes place in a manner similar to the first embodiment, when a digital signal with the amplitude of 2 mA is superposed on a bias current injected through the electrode 3. A light output 6 emitted from the laser 1 of FIG. 3 is transmitted through the polarizer 5 and converted to a modulation light 7 whose waveform corresponds to the waveform of a signal current.

In this embodiment, the pitch of the diffraction grating is formed such that the distributed feedback wavelength becomes a wavelength which is shorter than the gain peak wavelength of the active layer 32 or at which absorption is small. Therefore, a high power laser can be obtained. When the transition energy between ($E_{hh0}-E_{e0}$) is made equal to the transition energy between ($E_{1h0}-E_{e0}$), it is not always necessary to make the distributed feedback wavelength shorter than the gain peak wavelength of the active layer. In this case, a degree of freedom in design increases.

Third Embodiment

Figure 12:
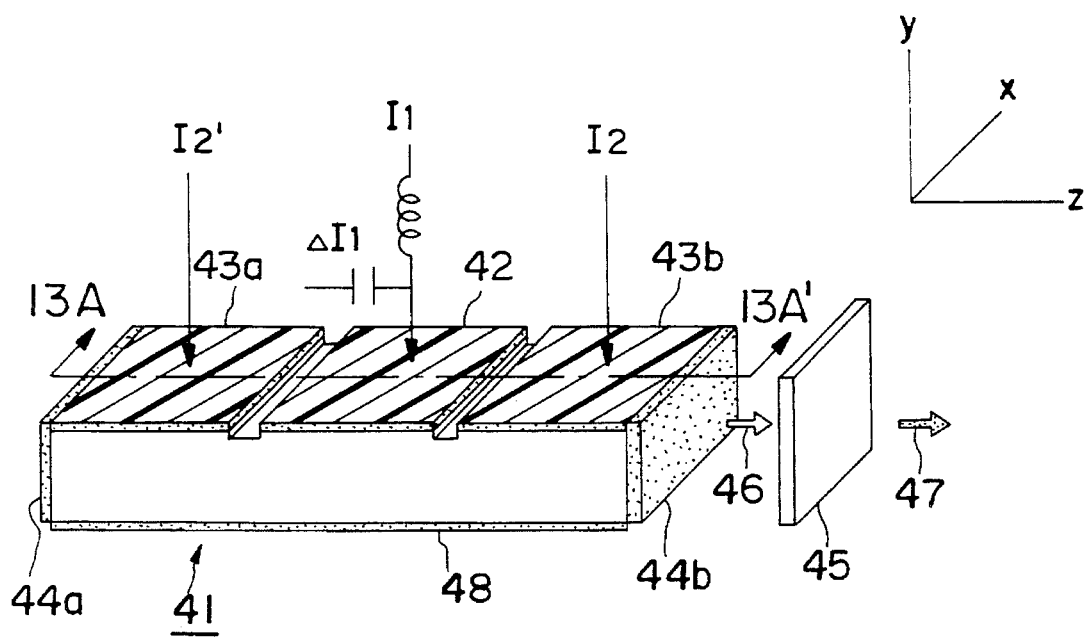
FIG. 12 illustrates the schematic structure of a further light source apparatus using a semiconductor laser constructed in accordance with the present invention.

A third embodiment of a semiconductor laser of the present invention will be described with reference to FIG. 12. In FIG. 12, reference numeral 41 designates a semiconductor of this embodiment, reference numerals 42, 43a, 43b and 48 designate electrodes, reference numerals 44a and 44b designate antireflection (AR) coatings, reference numeral 45 designates a Clan-Thompson prism which is used as a polarizer, reference numeral 46 designates light emitted from the semiconductor laser 41, and reference numeral 47 designates light transmitted through the polarizer 45.

Figure 13:
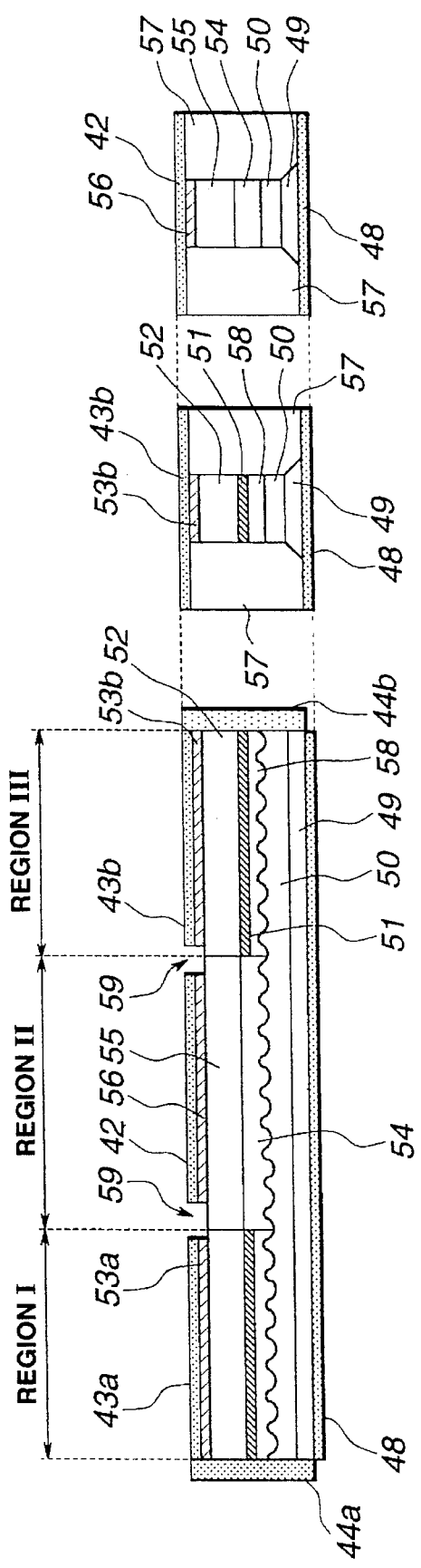
FIG. 13A is a cross sectional side view of the semiconductor laser used in FIG. 12, and FIGS. 13B and 13C are respectively cross sectional views of the same taken along different lateral lines.

The construction of the semiconductor laser 41 is shown in FIGS. 13A–13C. FIG. 13A illustrates a side cross section taken along a line 13A—13A' in FIG. 12. FIG. 13B illustrates a front cross section of a region where the electrode 43b is formed. FIG. 13C illustrates a front cross section of a region where the electrode 42 is formed. The semiconductor laser of this embodiment is fabricated in the following manner.

On an n-type InP substrate 49, an n-type InP lower clad layer 50 is grown, and a first order diffraction grating having a depth of 0.05 μm is formed on the lower clad layer 50 using photolithography. Then, on the lower clad layer 50 on which the grating is formed, an n-type $In_{0.71}Ga_{0.29}As_{0.62}P_{0.38}$ lower guide layer 58 having a thickness of 0.2 μm, an active layer 51, a p-type InP upper clad layer 52 and p-type $In_{0.59}Ga_{0.41}As_{0.9}P_{0.1}$ contact layers 53a and 53b are formed in this order. The active layer 51 is constructed of a multi-quantum well structure which consists of ten pairs of intrinsic $In_{0.53}Ga_{0.47}As$ well layers (thickness: 50 Å) and intrinsic $In_{0.28}Ga_{0.72}As$ barrier layers (thickness: 50 Å). Those well and barrier layers are alternately layered. Those semiconductor layers are grown using MBE, CVD or the like.

The fabricated semiconductor layers are divided into three regions I, II and III along the laser resonance direction, and layers 58, 51, 52, 53a and 53b at the center region II are removed. At this center region II, an intrinsic $In_{0.71}Ga_{0.29}As_{0.62}P_{0.38}$ lower guide layer 54, a p-type InP upper clad layer 55 and a p-type $In_{0.59}Ga_{0.41}As_{0.9}P_{0.1}$ contact layer 56 are regrown.

In an etching process, parts of the substrate 49 and the semiconductor layers formed thereon are removed and a mesa stripe portion is formed extending in the laser resonance direction. Then, a high-resistance InP burying layer 57 is grown on the surroundings of the mesa stripe portion to bury the surroundings, using LPE. A Cr/AuZnNi/Au film is deposited on the contact layers 53a, 53b and 56 and burying layer 57, and the Cr/AuZnNi/Au film is divided at groove-like separation portions 59 which extend down to the contact layers and burying layer 57. Thus, electrodes 42, 43a and 43b are formed. Further, an electrode 48 of AuGeNi/Au film is formed on the bottom of the substrate 49 and the burying layer 57. Antireflection coatings 44a and 44b of $SiO_2$ film are provided on end facets of the layered semiconductor layers.

In this embodiment, the switching between TE and TM modes takes place in a manner similar to the second embodiment, when bias currents are injected across the elecrodes 42, 43a and 43b and the electrode 48 and a digital signal with the amplitude of 2 mA is superposed only on the bias current injected through the electrode 42. The light output 46 emitted from the laser 41 of FIG. 12 is transmitted through the polarizer 45 and converted to modulated light 47 whose waveform corresponds to the waveform of a signal current.

In this embodiment, the wavelength corresponding to the transition energy between $E_{1h0}-E_{e0}$ is approximately 1.56 μm, and the wavelength corresponding to the transition energy between $E_{1h0}-E_{e0}$ is also approximately 1.56 μm.

The pitch of the diffraction grating is set to 240 nm such that the distributed feedback wavelength by the diffraction grating formed on the lower clad layer 50 is shorter than the wavelength corresponding to $E_{1h0}$–$E_{e0}$. Thus, the resonance peak of TE mode becomes 1.562 μm and the resonance peak of TM mode becomes 1.558 μm.

In this embodiment, the center region II of the laser cavity is formed for phase adjustment, and the light guide layer 54 is constructed in place of the active layer in the center region II. Therefore, switching with less absorption and smaller gain variation is achieved, compared to the second embodiment, and modulation control having a stable output is obtained.

Fourth Embodiment

Figure 14:
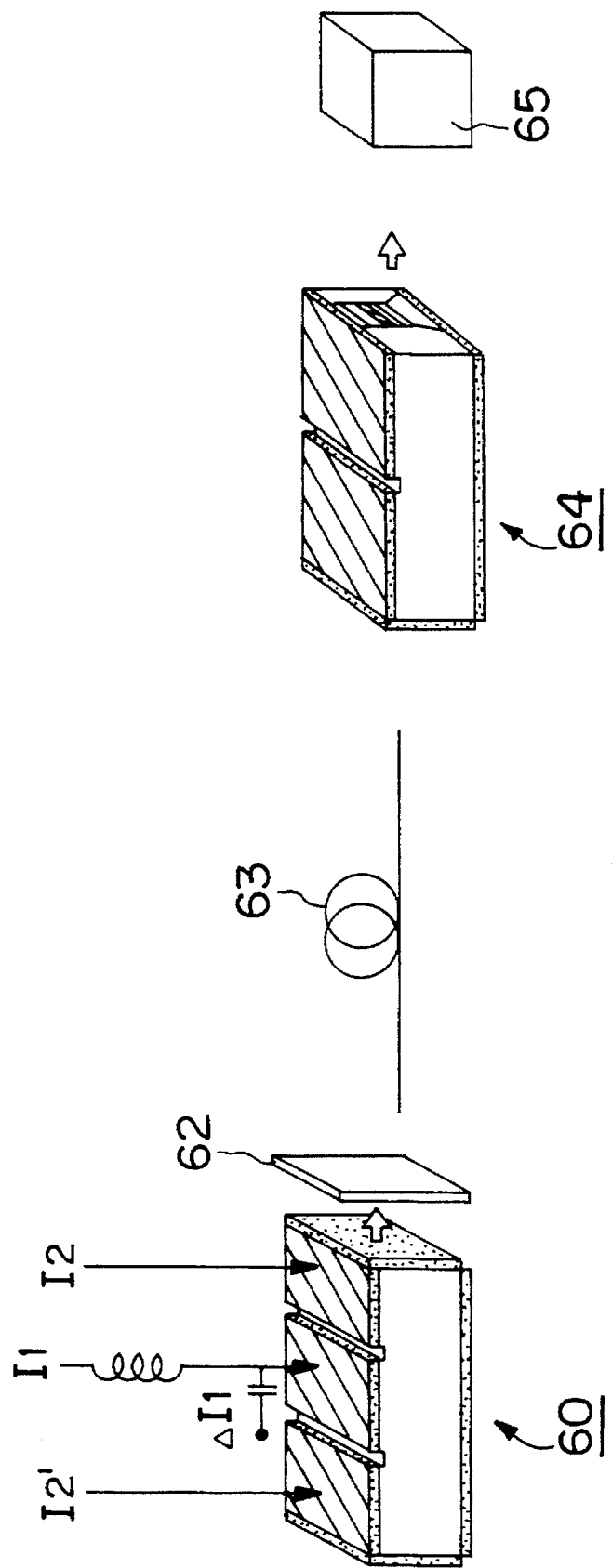
FIG. 14 illustrates the schematic structure of an optical communication system constructed in accordance with the present invention.
Figure 15:
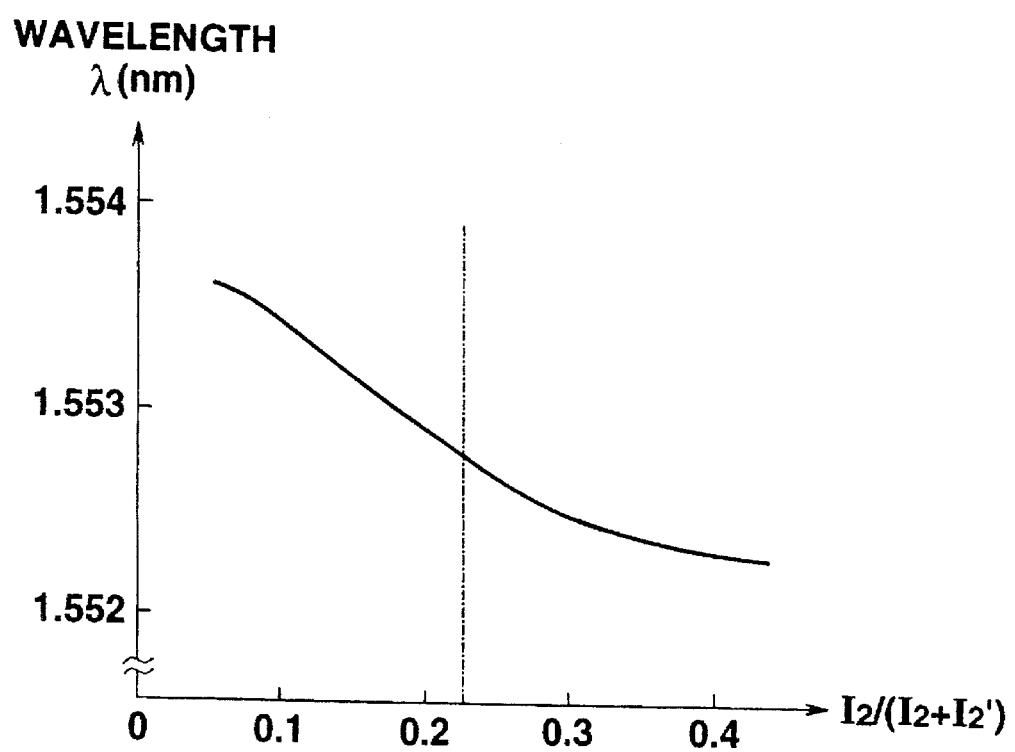
FIG. 15 illustrates the relationship between oscillation wavelength and a ratio of currents injected through two electrodes of the semiconductor laser of FIG. 14.
Figure 16:
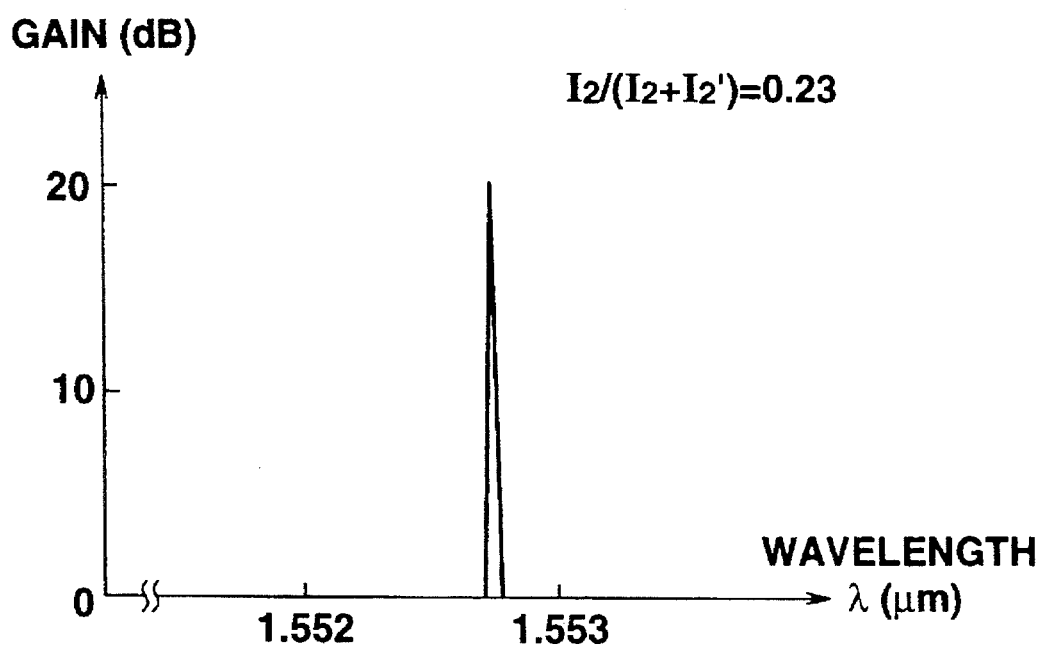
FIG. 16 illustrates a gain spectrum of the semiconductor laser of FIG. 14.

FIG. 14 illustrates an optical communication system using the above-discussed semiconductor laser. In FIG. 14, reference numeral 60 is a semiconductor laser of the third embodiment that is a three-electrode DFB laser. Currents $I_2{}'$, $I_1$, and $I_2$ are injected through the respective electrodes, and the oscillation wavelength can be changed while maintaining a single longitudinal mode, by controlling a ratio between those currents. An example of the current ratio dependency of the oscillation wavelength is illustrated in FIG. 15. As illustrated in FIG. 15, the wavelength can be varied over a changeable range of about 1 nm with a single longitudinal mode being maintained, by changing a ratio of current $I_2$ relative to current $(I_2+I_2')$. FIG. 16 illustrates the gain spectrum of the semiconductor laser in the case of $I_2/(I_2+I_2')=0.23$. Thus, even if the wavelength is varied, a single longitudinal mode is maintained. When a modulation current $\Delta I_1$ corresponding to a transmission signal having the amplitude of 2 mA is superposed on the bias current $I_1$, the semiconductor laser 60 emits light whose polarization direction is modulated in accord with the transmission signal.

The light emitted from the laser 60 is transmitted through a polarizer 62, and converted to light which has a given single polarization direction and whose intensity is modulated. The modulated light is coupled to an optical fiber 63 and transmitted therethrough. In this embodiment, a dispersion shift single mode fiber for a 1.55 μm band is employed as the optical fiber 63. When light in the 1.3 μm band or the 0.8 μm band is transmitted, an appropriate optical fiber therefor is used. The signal light transmitted through the optical fiber 63 is selectively demultiplexed by a tunable optical filter 64 of a DFB laser structure, and the demultiplexed light is converted to an electric signal by a photodetector 65.

Figure 17:
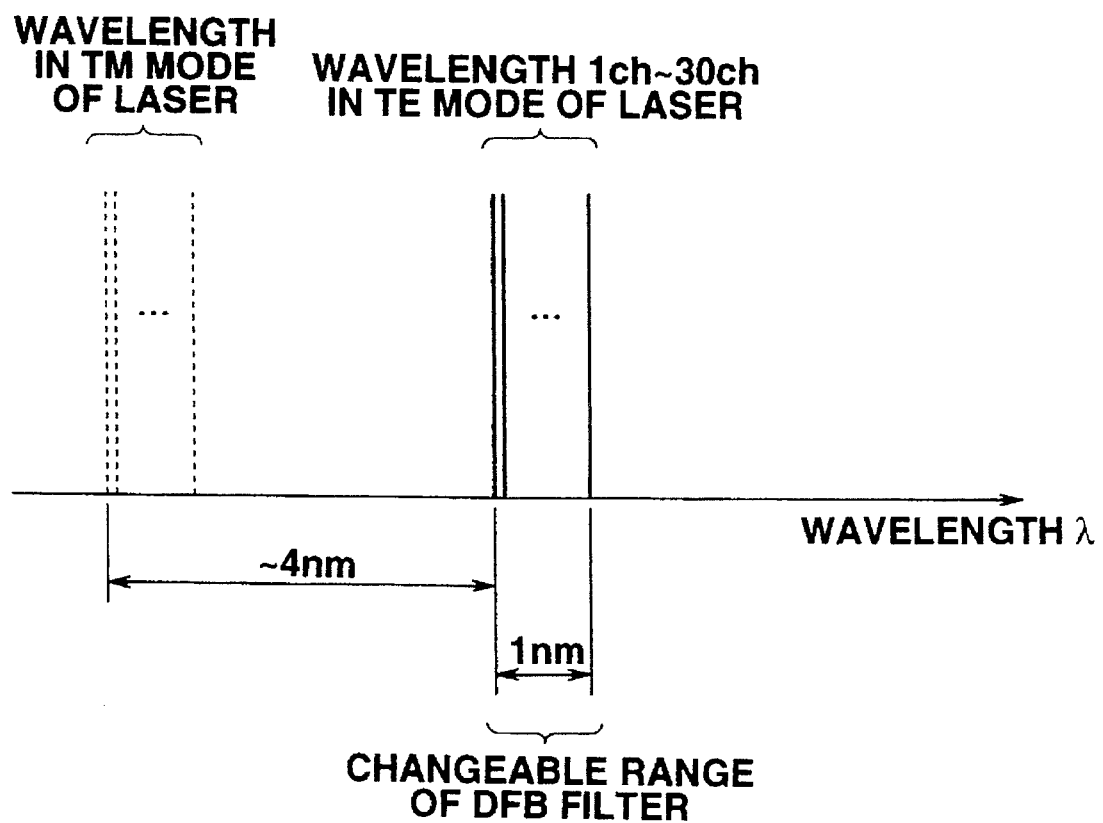
FIG. 17 illustrates wavelength spectra of an optical communication system constructed in accordance with the present invention.

An optical frequency multiplexing method using the optical communication system of this embodiment will be described with reference to FIG. 17. In the optical communication system of FIG. 14, the polarization direction of light output from the semiconductor laser 60 is switched corresponding to a transmission signal. Only light having a given polarization direction is selected by the polarizer 62. Therefore, it is generally considered that the modulation efficiency of transmitted light is determined by the extinction ratio of the polarizer 62, and hence a polarizer having a large extinction ratio is needed.

In this embodiment, however, a difference in oscillation wavelength between TE and TM modes of the semiconductor laser 60 is about 4 nm. Therefore, if the transmission wavelength of the optical filter 64 is tuned to the oscillation wavelength in one polarization mode, for example, TE mode, which is used for communication, the wavelength in TM mode falls outside of the wavelength changeable range of the filter as shown in FIG. 17, and hence no crosstalk occurs. As a result, even if the extinction ratio of the polarizer 62 is small, crosstalk between signals of "1" and "0", which has been the problem in a conventional FSK modulation, can be eliminated.

In this embodiment, the wavelength changeable range of the optical filter 64 is 1 nm and its 10 dB-down transmission bandwidth is 0.03 nm. Therefore, the multiplexing transmission of about 30 channels becomes possible from 1 nm/0.03 nm by performing multiplexing at wavelength intervals of about 0.03 nm. Thus, crosstalk of less than 10 dB is achieved.

Fifth Embodiment

A fifth embodiment will be described with reference to FIGS. 18 and 19. The fifth embodiment is directed to an optical local area network (LAN) system using a semiconductor laser of the present invention. FIG. 19 illustrates an opto-electric converting unit (node), which is connected to a terminal of the optical LAN system shown in FIG. 18.

Figure 18:
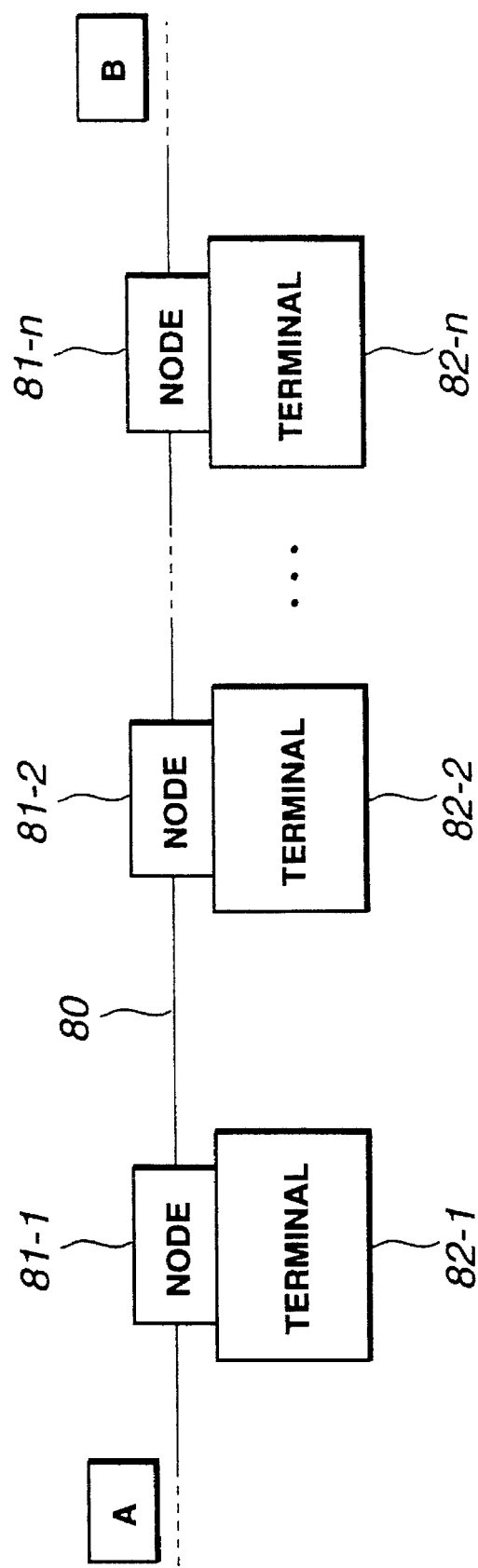
FIG. 18 illustrates the schematic structure of an optical LAN system using a semiconductor laser constructed in accordance with the present invention.
Figure 19:
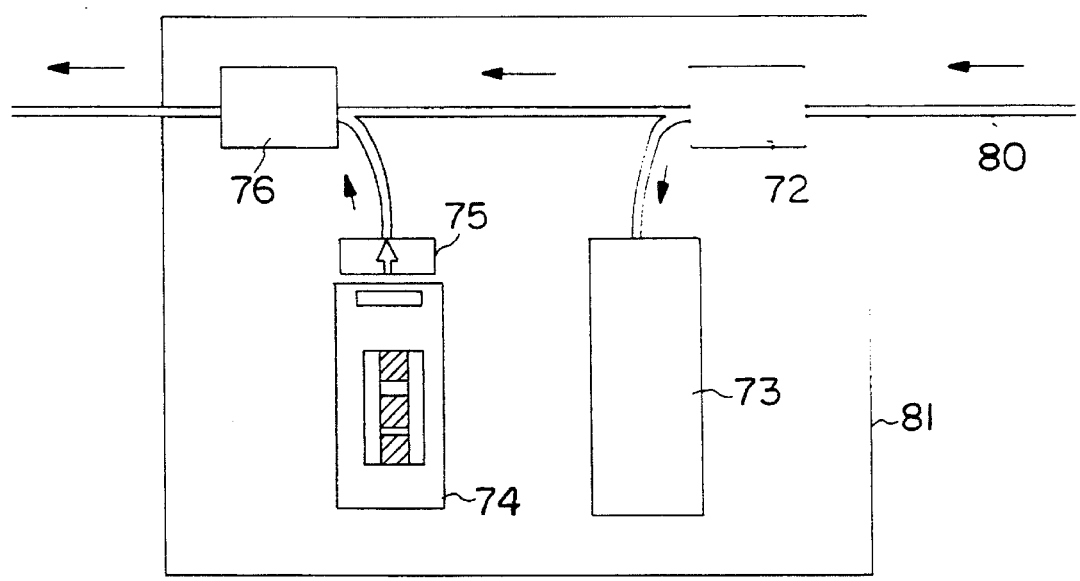
FIG. 19 illustrates the structure of an optical node used in a system of FIG. 18.

In the bus-type network shown in FIG. 18, multiple terminals 82-1, 82-2, . . . , 82-n are respectively connected to an optical fiber 80 through nodes 81-1, 81-2, . . . , 81-n along a direction A–B. At some places on the optical fiber 80, optical amplifiers (not shown) are serially connected to compensate for attenuation of the transmitted signal light.

In FIG. 19, a light signal is taken into the node 81 through the optical fiber 80, and a portion of the signal is input into an optical receiver 73 by a branching device 72. The optical receiver 73 includes the tunable optical filter 64 and the photodetector 65 shown in FIG. 14, for example, and only signal light at a desired wavelength is taken out from the incident signal light, and the signal is detected.

On the other hand, when a light signal is transmitted from the node 81, signal light from a light source apparatus 74 as shown in FIGS. 3 or 12 is input into the optical fiber 80 at a combining portion 76 through an isolator 75.

In this embodiment, the optical frequency multiplexing method as described in the fourth embodiment is used for light transmission. A plurality of optical receivers and light source apparatuses may be arranged in a node to widen the wavelength changeable range. Further, two nodes may be connected to each terminal and two optical fibers may be provided to accomplish bi-directional transmission of a DQDB system.

As a network, a loop type, which is constructed by connecting A and B in FIG. 18, a star type or a compound configuration thereof may be used.

Sixth Embodiment

Figure 20:
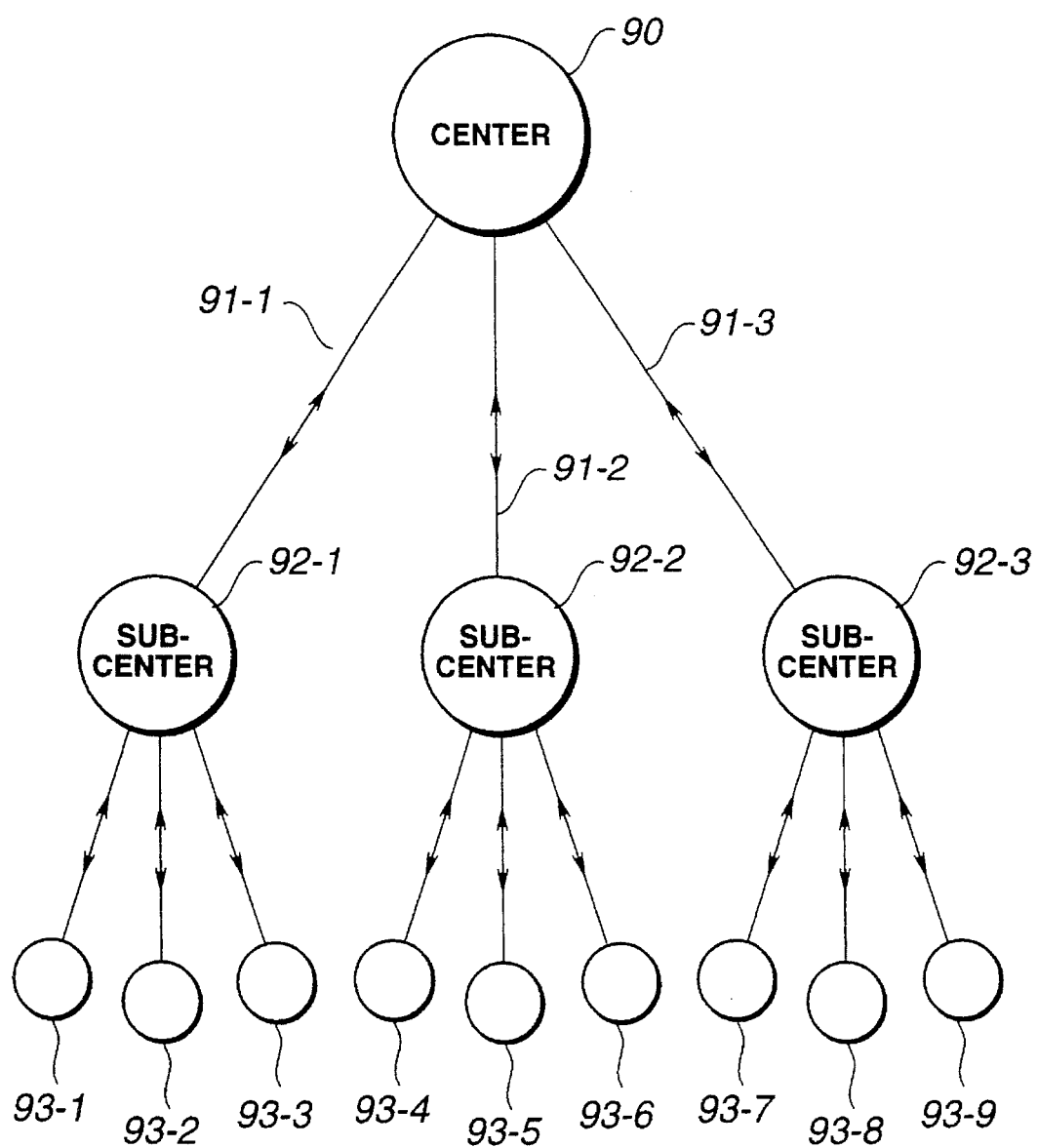
FIG. 20 illustrates the schematic structure of a bi-directional optical CATV system using a semiconductor laser constructed in accordance with the present invention.

A bi-directional optical CATV system, as shown in FIG. 20, can be constructed using a semiconductor laser of the present invention. In FIG. 20, reference numeral 90 is a CATV center, reference numerals 92-1, 92-2 and 92-3 are respectively sub-centers connected to the center 90 by optical fibers 91-1, 91-2 and 91-3, and reference numerals 93-1, 93-2, . . . , 93-9 are respectively receivers of subscribers connected to the sub-centers 92-1, 92-2 and 92-3. In the center 90, a light source apparatus as shown in FIG. 3 or FIG. 12 is arranged, and a plurality of video signals are carried on signal light of different wavelengths to transmit the signals to the receivers 93-1, 93-2, . . . , 93-9. Each receiver includes a tunable wavelength filter 64 and a photodetector 65 as shown in FIG. 14, and only signal light at a desired wavelength of input signal light is detected to reproduce a picture image on a monitor. On the subscriber side, the transmission wavelength of the tunable filter is changed to select a desired channel. Thus, a desired picture image can be obtained.

Further, a bi-directional CATV is possible in the following manner. The receiver 93 has an external modulator (an example of a simple bi-directional optical network, an optical local area network (LAN) system CATV, see, for example, Ishikawa and Furuta "LiNbO$_3$ Optical Wavelength Modulator For Bi-directional Transmission in Optical CATV Subscriber Systems", OCS 91-82 1991), and a signal from the subscriber is received as a reflected light (reflected light of a signal light transmitted to the subscriber) from its external modulator. Thus, highly improved services can be obtained.

According to the present invention, a semiconductor laser is constructed such that one of two polarization mode oscillations is selectively performed and minimum values of threshold gains in respective polarization modes near Bragg wavelength are made approximately equal to each other. As a result, it is possible to drive the laser by a minute modulation current, and degradation of response characteristics due to dynamic wavelength fluctuation at a high frequency can be prevented when the laser is used in optical communications.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. A distributed feedback semiconductor laser for oscillating by switching two polarization modes having different polarization planes, said laser comprising:
   a substrate;
   a light waveguide formed on said substrate, said waveguide at least partially including an active layer;
   a diffraction grating formed around said waveguide, said waveguide and said grating being constructed such that minimum values of threshold gain in the polarization modes near a Bragg wavelength are approximately equal to each other; and
   injecting means for injecting a modulation current for switching the two polarization modes into a portion of said waveguide.

2. A distributed feedback semiconductor laser according to claim 1, wherein said active layer comprises a multi-quantum well structure, and a pitch of said grating is set such that the Bragg wavelength is shorter than a peak wavelength of a gain spectrum of said active layer.

3. A distributed feedback semiconductor laser according to claim 1, wherein said active layer comprises a multi-quantum well structure, and said multi-quantum well structure is constructed such that a tensile strain is introduced into said multi-quantum well structure and a level of light holes, which is a second level of holes in said active layer, is equal to or higher than a level of heavy holes which is a ground level of holes.

4. A distributed feedback semiconductor laser according to claim 1, wherein said laser is divided into a first region, into which a bias current is injected, and a second region, into which the modulation current is injected by said injecting means, along a resonance direction, and said active layer is formed in both said first and second regions.

5. A distributed feedback semiconductor laser according to claim 1, wherein said laser is divided into a first region, into which a bias current is injected, and a second region, into which the modulation current is injected by said injecting means, along a resonance direction, and said active layer is formed only in said first region.

6. A distributed feedback semiconductor laser according to claim 1, wherein said waveguide and said grating being constructed such that oscillation wavelengths of the different polarization modes are different from each other and a pitch of said grating is set such that the Bragg wavelength is shorter than a peak wavelength of a gain spectrum of said active layer.

7. An optical communication system comprising:
   (a) a transmitter including a light source apparatus, said light source apparatus including:
      a distributed feedback semiconductor laser for oscillating by switching two polarization modes having different polarization planes, said laser comprising:
         a substrate;
         a light waveguide formed on said substrate, said waveguide at least partially including an active layer;
         a diffraction grating formed around said waveguide, said waveguide and said grating being constructed such that minimum values of threshold gain in the two polarization modes near a Bragg wavelength are approximately equal to each other; and
         means for injecting a modulation current for switching the two polarization modes into a portion of said waveguide; and
      means for selecting only light in one of the two polarization modes from light outputs in the two polarization modes emitted by said laser;
   (b) transmission means for transmitting the light selected by said selecting means; and
   (c) a receiver for receiving the light transmitted by said transmission means.

8. An optical communication system according to claim 7, wherein said receiver comprises an optical wavelength filter.

9. An optical communication system according to claim 7, wherein said laser is constructed such that two bias currents and the modulation current are injected into respective portions of said waveguide and the oscillation wavelengths of said laser are changeable by changing a ratio between two bias currents, and said receiver comprises an optical tunable wavelength filter.

10. A light source apparatus comprising:
   a distributed feedback semiconductor laser for oscillating by switching two polarization modes having different polarization planes, said laser comprising:
      a substrate;
      a light waveguide formed on said substrate, said waveguide at least partially including an active layer;
      a diffraction grating formed around said waveguide, said waveguide and said grating being constructed such that minimum values of threshold gain in the two polarization modes near a Bragg wavelength are approximately equal to each other; and means for injecting a modulation current for switching the two polarization modes into a portion of said waveguide; and means for selecting only light in one of the two polarization modes from light outputs of the two polarization modes emitted by said laser.

11. An optical communication method comprising the steps of:

(a) preparing a light source apparatus, said light source apparatus including:

a distributed feedback semiconductor laser for oscillating by switching two polarization modes having different polarization planes, said laser comprising:

a substrate;

a light waveguide formed on said substrate, said waveguide at least partially including an active layer;

a diffraction grating formed around said waveguide, said waveguide and said grating being constructed such that minimum values of threshold gain in the two polarization modes near a Bragg wavelength are approximately equal to each other; and means for injecting a modulation current for switching the two polarization modes into a portion of said waveguide; and means for selecting only light in one of the two polarization modes from light outputs in the two polarization modes emitted by said laser;

(b) supplying to the laser a current which is produced by superposing a modulation current, modulated in accordance with a transmission signal, on a predetermined bias current;

(c) selecting a light signal which is intensity-modulated in accordance with the transmission signal by the selecting means; and (d) transmitting the light signal to a receiver.

\* \* \* \* \*

UNITED STATES PATENT AND TRADEMARK OFFICE
CERTIFICATE OF CORRECTION

PATENT NO. : 5,586,131

DATED : December 17, 1996

INVENTOR(S) : TAKEO ONO, ET AL.

Page 1 of 2

It is certified that error appears in the above-identified patent and that said Letters Patent is hereby corrected as shown below:

On the title page,

Item [56] REFERENCES CITED

FOREIGN PATENT DOCUMENTS

"2159781   9/1990   Japan." should be deleted.

COLUMN 2

Line 20, "Laind-Open" should read --Laid-Open--.

COLUMN 3

Line 16, "modulations" should read --modulation--.

COLUMN 7

Line 61, "an" should read --a--.

UNITED STATES PATENT AND TRADEMARK OFFICE
CERTIFICATE OF CORRECTION

PATENT NO. : 5,586,131

DATED : December 17, 1996

INVENTOR(S) : TAKEO ONO, ET AL.

Page 2 of 2

It is certified that error appears in the above-identified patent and that said Letters Patent is hereby corrected as shown below:

<u>COLUMN 10</u>

Line 5, "Clan-Thompson" should read --Glan-Thompson--.

<u>COLUMN 13</u>

Line 41, "sprit" should read --spirit--.

<u>COLUMN 14</u>

Line 17, "being" should read --are--.

Signed and Sealed this

Ninth Day of September, 1997

Attest:

BRUCE LEHMAN

Attesting Officer

Commissioner of Patents and Trademarks